United States Patent [19]

Roy

[11] Patent Number: 4,630,030

[45] Date of Patent: Dec. 16, 1986

[54] COMPRESSION OF DATA FOR STORAGE

[75] Inventor: Roland W. Roy, Chelmsford, Mass.

[73] Assignee: Wang Laboratories, Inc., Lowell, Mass.

[21] Appl. No.: 625,877

[22] Filed: Jun. 28, 1984

[51] Int. Cl.$^4$ ............................................. H03K 13/22
[52] U.S. Cl. .............................. 340/347 DD; 358/260
[58] Field of Search ................... 340/347 DD; 302/56; 358/260

[56] References Cited

U.S. PATENT DOCUMENTS

3,945,002 3/1976 Duttweiler et al. ........ 340/347 DD

Primary Examiner—William M. Shoop, Jr.
Assistant Examiner—Sharon D. Logan
Attorney, Agent, or Firm—Michael H. Shanahan; Gordon E. Nelson

[57] ABSTRACT

A method is disclosed for compressing binary numbers to be stored in a memory. A first number to be stored is first determined to be in one of several bit size ranges, and depending on the bit size range a fixed value number is subtracted from the first number. A second number resulting from the subtraction process has two binary bits are prefixed thereto and the combination is stored in memory. The two binary bit prefix identifies the particular bit size range and thereby the fixed value number originally subtracted from the first number. On reading out the second number with two bit prefix, the fixed value number identified by the two bit prefix is added back to the second number to get the first number. The combination of the second number plus two bit prefix has fewer total bits than the first number thus achieving compression of the first number.

13 Claims, 8 Drawing Figures

DATA BLOCK (40)

*Fig.1*

UNIVERSAL STORAGE BLOCK (10)

*Fig.2*

HEADER (20)

*Fig.3*

INDEX BLOCK (30)

*Fig. 6*
BLOCK INDEX (60)

- 61 DISK TITLE
- 62 VERSION #
- 63 # OF BLOCKS IN VTOC FILE
- 64 # OF BITS IN MAP
- 65 # OF FREE BLOCKS IN VTOC FILE
- 66 EXTEND BLOCK SIZE
- 67 BLOCK # FIRST DATA BLOCK
- 68 BLOCK # FIRST FREE BLOCK
- 69 BLOCK # LAST FREE BLOCK

- 91 # OF INDEX LEVELS IN FILE
- 92 FIRST BLOCK OF ADDRESS EXTENT A
- 93 LENGTH OF ADDRESS EXTENT A
- 94 FIRST BLOCK OF ADDRESS EXTENT X
- 95 LENGTH OF ADDRESS EXTENT X

COMPRESSION OF DATA FOR STORAGE

FIELD OF THE INVENTION

This invention relates to computer based systems including memory and is more particularly related to the allocation of space and compression of data in such systems.

BACKGROUND OF THE INVENTION

Computer systems, whether large or small, all have memory as a part thereof. This memory is in static and dynamic form. The contents of dynamic memories are lost when power to such memories is shut off. Static memory contents are not lost when power goes off and is in different forms such as ROM (read-only-memory), floppy diskette magnetic memory, large capacity hard disk magnetic memory, and bubble memory. Hard disk magnetic memory is often used in a computer system and is used for file storage, and files are usually assigned storage space therein. In the prior art typically a given amount of memory space is allocated wherein to store certain data, and that amount of space is inflexible so that even if all the space is not required, remaining space is wasted. Therefore there is never any real need to compress the binary information stored in these inflexible block segments. There is a need in the art for techniques to compress data stored in hard disk memory in order to maximize the amount of data that may be stored on the disk.

SUMMARY OF THE INVENTION

In accordance with the teaching of the present invention a hard disk memory file management system is disclosed which performs many file management functions that are known in the art, but in addition permits compression of data stored in the disk file management system file to thereby maximize the amount of information that may be stored therein. Data to be stored is compressed by subtracting certain numbers from the binary information or data, which is in thirty-two bit binary number form, before storage. This allows a corresponding reduction in the number of binary bits of a binary number to be stored. To be able to reconstruct the original information or data by decompression, two bits of the compressed number being stored indicate the number that was subtracted from the original information or data in binary number form, in order to now add it to the compressed number and thereby restore the uncompressed number. These two bits also indicate the total compressed size of the number.

THE DRAWING

The present invention will be better understood on reading the following detailed description in conjunction with the drawing in which.

DETAILED DESCRIPTION

Figure 8:
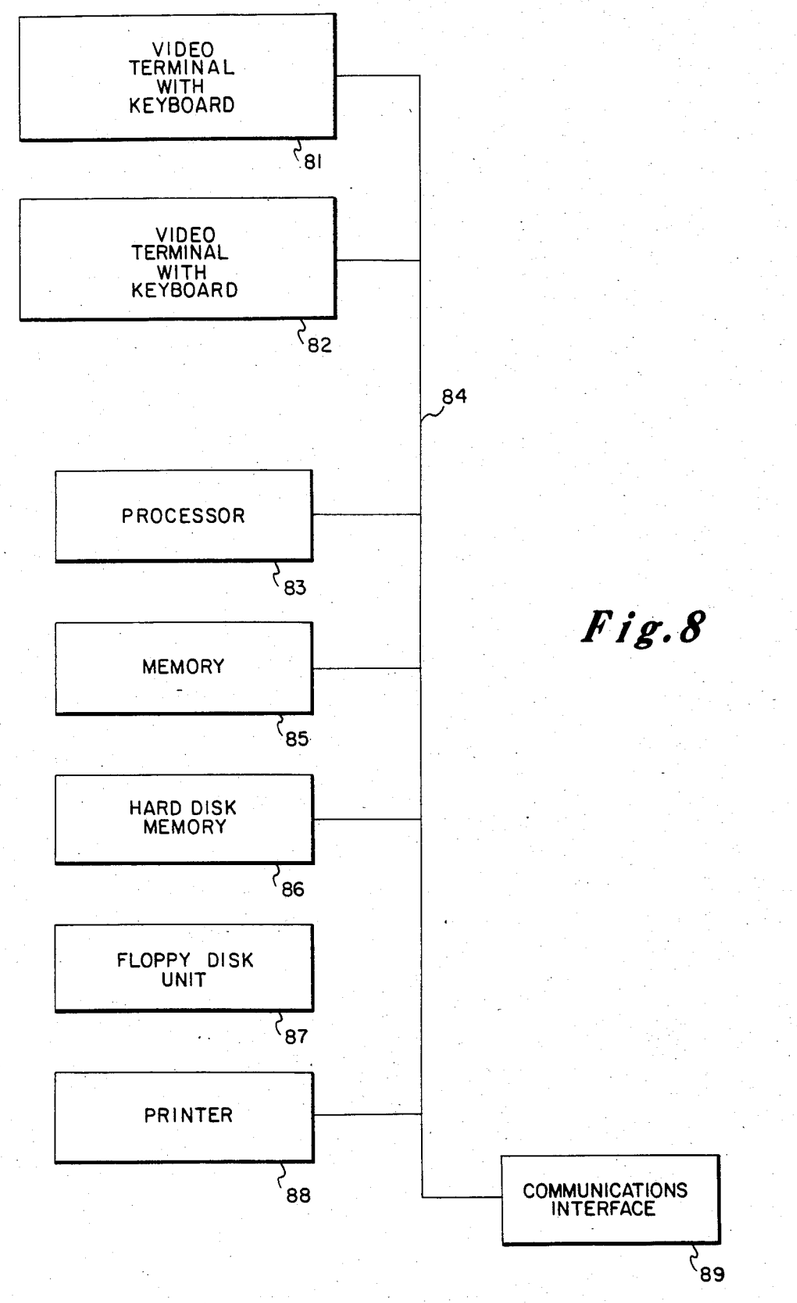
FIG. 8 is a block diagram schematic of a computer based system including a hard disk memory in which the present invention may be utilized.

In FIG. 8 is shown a block diagram of state of the art processing equipment system which includes a hard disk memory 86 as a bulk storage means for storing large amounts of data and files. This system comprises a plurality of video terminals 81 and 82 with keyboards which are used as input/output devices to input data and commands to the processing equipment, and to visually display data that is the result of processing, or which is stored in memories 85 or 86 of the system. The processing equipment also comprises a central processor 83 to which terminals 81 and 82 are connected via a bus 84 in a manner well known in the art. These terminals may also have onboard processors that are not shown, but which are well known in the display art. A memory 85 is provided in which is stored operating system and application programs and which is also used by processor 83 as a buffer store. Hard disk memory 86 is also provided and is a bulk storage device used for the storage of files of data etc. Hard disk 86 is operated by processor 83 under control of a disk file management system to store and retrieve information therein as may be requested by users of the processing equipment utilizing terminals 81 and 82. A floppy disk unit 87 is also provided to read/write data from/to floppy disks as is well known in the art. Floppy disks are utilized as an alternative memory storage for programs and data as is well known in the art. A printer 89 is also provided to obtain hard copy output of what is displayed on video display 10, or from files on hard disk memory 86 as requested by users at one of terminals 81 and 82. This processing equipment shown in FIG. 8 also has a communication interface 89 which permits the system to communicate with other systems and storage means to transfer data and perform other functions that are known in the art.

Processing equipment of the type generally described in the last paragraph is described in U.S. patent application Ser. No. 440,668, filed Nov. 10, 1982, entitled "Management Communication Terminal System". This patent application is incorporated herein by reference. A disk file management system in which the present invention may be utilized is described hereinafter, along with a detailed description of the present invention.

A disk file management system is required in order to perform supervisory functions with regards to storing and retrieving information from hard disk memory 86 as is well understood in the art. Functions such as assigning portions of memory to particular system users, keeping an index of what data is stored on the disk and where, and reading and writing information onto and off of the disk are examples of functions performed by the disk operating system. However, when a user fills up a quantity of memory assigned to them it is relatively difficult to expand the amount of assigned memory. An alternative in the prior art is not to assign quantities of memory to specific system users and let the memory be used on a first come first served basis. This causes a problem where it is desired to group a users files on one disk, and/or to a given area on the disk. The more that files are spread around on a given disk and on many disks, retrieval time can increase to unacceptable levels. Thus, it is advantageous to have portions of hard disk memory assigned to specific users; and it is very desirable to have the amount of assigned memory easily increased when the priorly assigned amount of hard disk memory approaches being filled.

To maximize the amount of information or data that may be stored in any memory, including hard disk memory, it is desirous to utilize data compression techniques on data before storage. Many data compression techniques are known and utilized in the art and they all have advantages and disadvantages which must be balanced off in selecting such a technique. Very seldom, if ever, is data compressed using one technique then reprocessed to compress it further using another technique. A method is taught herein to compress data for storage in the disk file management system file which by itself provides good data compression, but the compressed data output therefrom may be further compressed utilizing other techniques to achieve higher data compression.

Binary information or data stored on hard disk memory 86 is stored in a hierarchical tree structure format. With this form of storage fixed amounts of memory, or blocks of memory, are used to store the information, and as many blocks as are necessary to store the information are used. The multiplicity of blocks storing one set of binary information, which for example may represent a document, are all relationally tied together like an electrical string of beads so that when one block is accessed it contains logical block numbers of the immediately preceding and succeeding blocks so that they too may also be accessed. The logical block numbers are logical numbers of the location in memory from which addresses are obtained for succeeding blocks of binary information that are briefly mentioned in the last paragraph and will be described in greater detail further in this specification. Each group of binary words, including a Header, is stored in a 512 byte block of memory on hard disk memory 86. Each file on hard disk memory 86 also uses a number of 512 byte blocks of memory for storing administrative information regarding the file. This administrative information indicates, among other things, the identity of the associated document and the logical address in the disk memory.

Binary information representing a document that is to be stored on hard disk memory 86 is broken up into a multiplicity of groups of five-hundred twelve (512) binary words of sixteen binary bits each. Each such group of sixteen bit binary words is coupled with a header, which is a form of identification tag for the binary information representing a document, to make up a composite group of data that is as close to 512 bytes as possible. The Header also contains logical addresses of adjacent 1K blocks of memory. The system also uses a number of 512 byte blocks of memory for storing administrative information regarding the file. This administrative information indicates the identity of the associated document and the logical address in the disk memory where the first block of data for the document is stored. In addition, other blocks of memory are used by the disk file management system for storing other binary information about the the hard disk memory such as how much memory of each file has been used, how much memory in each particular file is still available for storage, the incremental amount of unused memory on the hard disk to be added to a file when it is self-extended, and the amount and logical addresses of disk memory space that is not assigned to any file.

U.S. patent application Ser. No. 490,814, filed May 2, 1983, entitled Sparse Array Bit Map Used in Data Bases is incorporated herein by reference, and it teaches tree structures used with data base organization.

Figure 1:
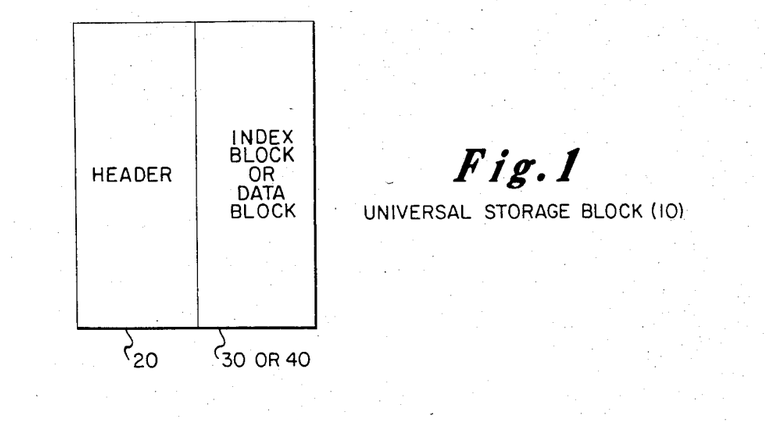
FIG. 1 shows the general organization of a universal storage element used for storing information in a disk file system.
Figure 2:
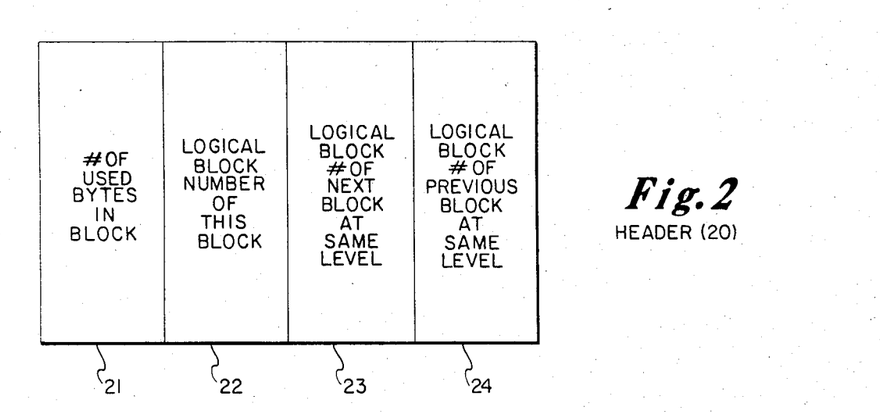
FIG. 2 shows the organization of information for a header of a storage element used in implementing a disk file management system utilizing the present invention.
Figure 3:
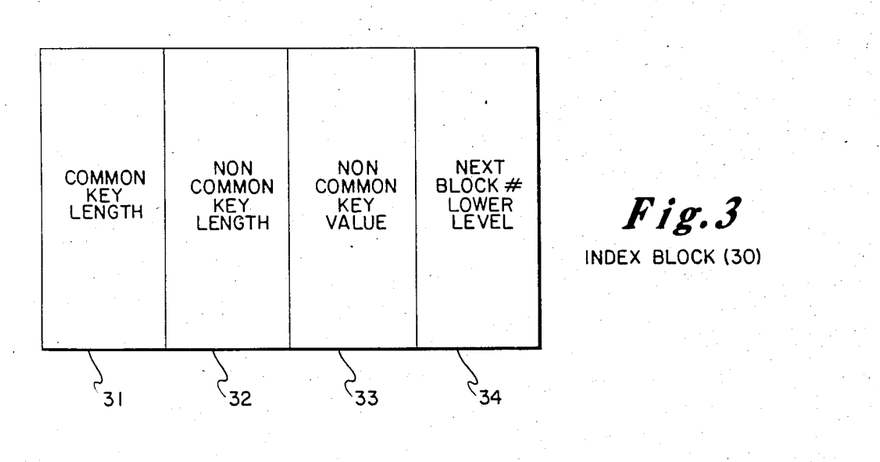
FIG. 3 shows the organization of information for an index block which is coupled with a header for an index storage element used by a disk file management system utilizing the present invention.
Figure 4:
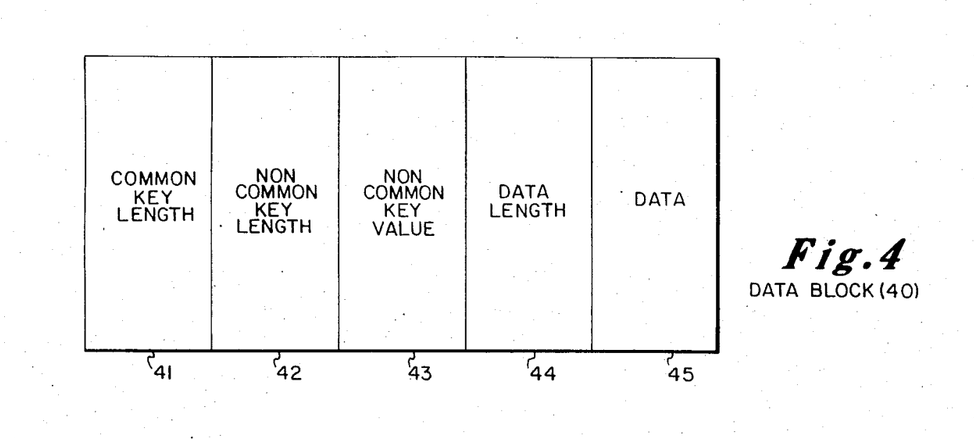
FIG. 4 shows the organization of information for a data block which is coupled with a header to make a data storage element used by a disk file management system utilizing the present invention.

As shown in FIG. 1 each block of memory is generically organized to have a Header 20 and either an Index Block 30 if used for index storage purposes, or a Data Block 40 if used for data storage purposes. Details of the organization of Header 20 are shown in FIG. 2 and are described below. Details of an Index Block 30 are shown in FIG. 3 and are described below. Details of a Data Block 40 are shown in FIG. 4 and are described below.

In FIG. 2 is shown the organization of binary data within a Header 20. As may be seen in FIG. 2 Header 20 has four basic components, located in blocks that are called block segments hereinafter in this specification. These block segments are also called fields by some skilled in the art. The block segments represent the organization or order in which information is stored in a block of memory. Block segment 21 comprises two bytes, or a total of sixteen binary bits, and is used to store a binary number indicating the number of eight-bit bytes stored in the associated byte block of memory. This in essence tells the system how full the block is so that the system does not read zeroes in empty bytes of the block and construe them as information bearing binary words. When all zeroes are stored in block segment 21 it indicates to the disk file management system that the block is a 'free' block with nothing stored therein. A 'free' block may be used for subsequent storage of binary information representing index or data information. When the two eight-bit binary words stored in block segment 21 have other than all zeroes stored therein the system knows that the block is being used for for storage of index or data information and, in that event, obtains other information from the binary words stored therein other than the number of bytes stored in the block. The highest order bit of the sixteen bits is used for the last stated purpose. When the highest order bit is a zero the system knows that the block of memory from which this bit is read is an index block. Similarly, when the highest order bit is a one the system knows that the block of memory from which this bit is read is a data block.

Block segment 22 also comprises two bytes, or a total of sixteen binary bits, and is used to store two eight-bit binary numbers indicating the logical block number of the memory block in which this Header is stored. The logical block number is a logical address on disk memory 86 and is used in locating the block in the memory. The next block segment 23 comprises two eight-bit bytes, or a total of sixteen binary bits, and is used to store a binary number indicating the logical block number of the block of memory at the same level in the memory tree structure. The final block segment in Header 20 is block 24 which also comprises two bytes, for a total of sixteen binary bits, and is used to store a binary number indicating the logical block number of the previous block of memory at the same level in the relational memory tree structure. If the block of memory 86 to which the Header is attached is the first block at the same level there will be all zeroes stored in block segment 24, otherwise there will be a binary number stored therein which is the logical address of the preceding block of memory at the same level. The concept of 'level' in the tree structure as regards the storage of data in memory 86 will be better understood with the description of FIG. 7 further in this detailed description. A Header 20, which has just been described, is prefixed to the front end of index information or data information to make up a group of binary words that are stored in a block of memory in hard disk memory 86.

In FIG. 3 is shown Index Block 30 which is comprised of four block segments. Block segments 31, 32, and 33 are used to store the identity of a document that is stored in one or more blocks of memory, but the identity is stored in a compressed fashion. Block segment 31 is entitled Common Key Length, and block segment 32 is entitled Non-common Key Length. In a file in which are stored a number of documents the Index Headers are stored in alphanumeric order. For example, assume that a document entitled 'WAND' has already been stored in a given file on hard disk memory 86, and the system is now going to store another document entitled 'WANG' in the same file. Storage of each of these two documents requires a multiplicity of memory blocks for storing Index Headers 20 with Blocks 30, and Data Headers 20 with Data Blocks 40. The disk file management system first looks at the title 'WANG' of the new document to be stored and then locates the Index Header and Block for the 'WAND' document. The system determines that the first three digits WAN are common between the two documents. Accordingly, block segment 31 for the 'WANG' document has a common key length of 3 stored therein representing the three characters 'WAN', which are common with the preceding 'WAND' file. In block segment 32 of Index Block 30, entitled Non Common Key Length, the binary number 1 is stored therein indicating that there is only one alphanumeric character different between the 'WAND' and 'WANG' documents. In block segment 33 is then stored the binary representation for the one non-common character 'G'. In this manner the document title 'WANG' is stored in a compressed fashion and the system can locate the document in memory 86.

The fourth block segment in Index Block 30 is entitled Next Block Number Lower Level and indicates the logical block number of the next lower level block starting with the same key ('WANG'). The concept of 'level' in the tree structure as regards the storage of data in memory 86 will be better understood with the description of FIG. 7 in this detailed description.

In FIG. 4 is shown Data Block 40 which is comprised of five block segments 41 to 45. Block segments 41, 42, and 43 are used to store the identity of the document that is stored in one or more blocks of memory, but the identity is stored in a compressed fashion. Block segment 41 is entitled Common Key Length, block segment 42 is entitled Non Common Key Length, and block segment 43 is entitled Non Common Key Value. These block segments are identical to those described above for Index Block 30, so are not described again. In block segment 44 entitled Data Length is stored a binary number indicating the number of binary words of data representing part or all of a document stored in this particular Data Block 40. In block segment 45 is stored the actual data representing all or part of the document in binary form. For the reasons described in greater detail hereinafter, the binary information stored in block segment 45 is stored in essence in duplicate. That is, as data is read out of disk memory for editing etc., it is read out of one-half of block segment 45, is then edited, and is then stored back in the other half of block segment 45. Each time the data is read out for say editing, the half of block segment 45 from which the data is read alternates. Thus, the immediately previous version of the data is saved in the case of data loss to prevent complete loss of the data. As mentioned previously, all eight-bit bytes in a block of memory may not be filled, which is the purpose for the binary number stored in block segment 21, Number Of Used Bytes In Block, in a Header 20 attached to the front end of a Data Block 40.

Figure 5:
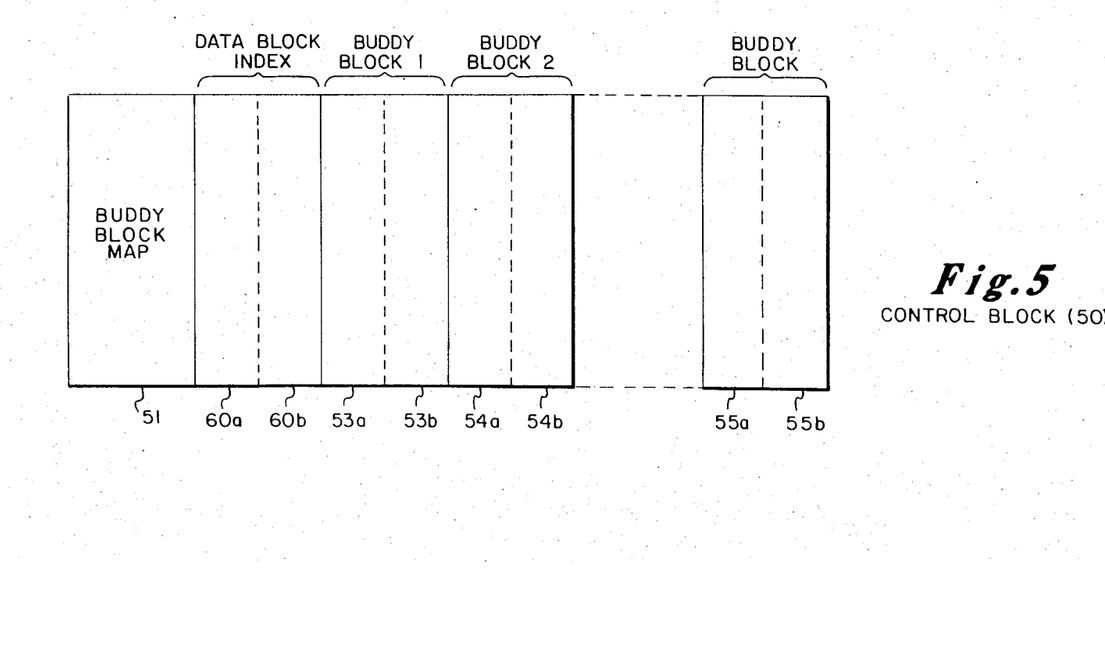
FIG. 5 shows the organization of information in a control block which represents a disk file management system utilizing the present invention.
Figure 6:
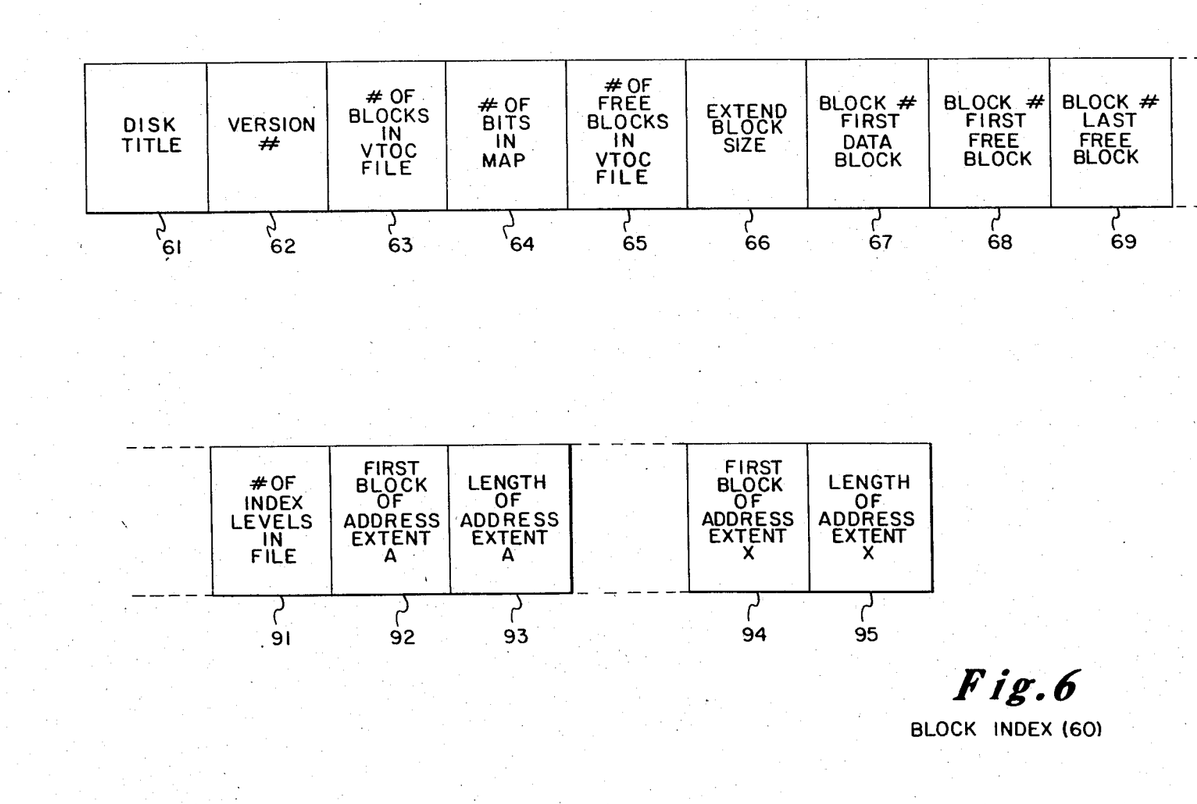
FIG. 6 shows the organization of information of a block index in the control block used by the file management system utilizing the present invention.
Figure 7:
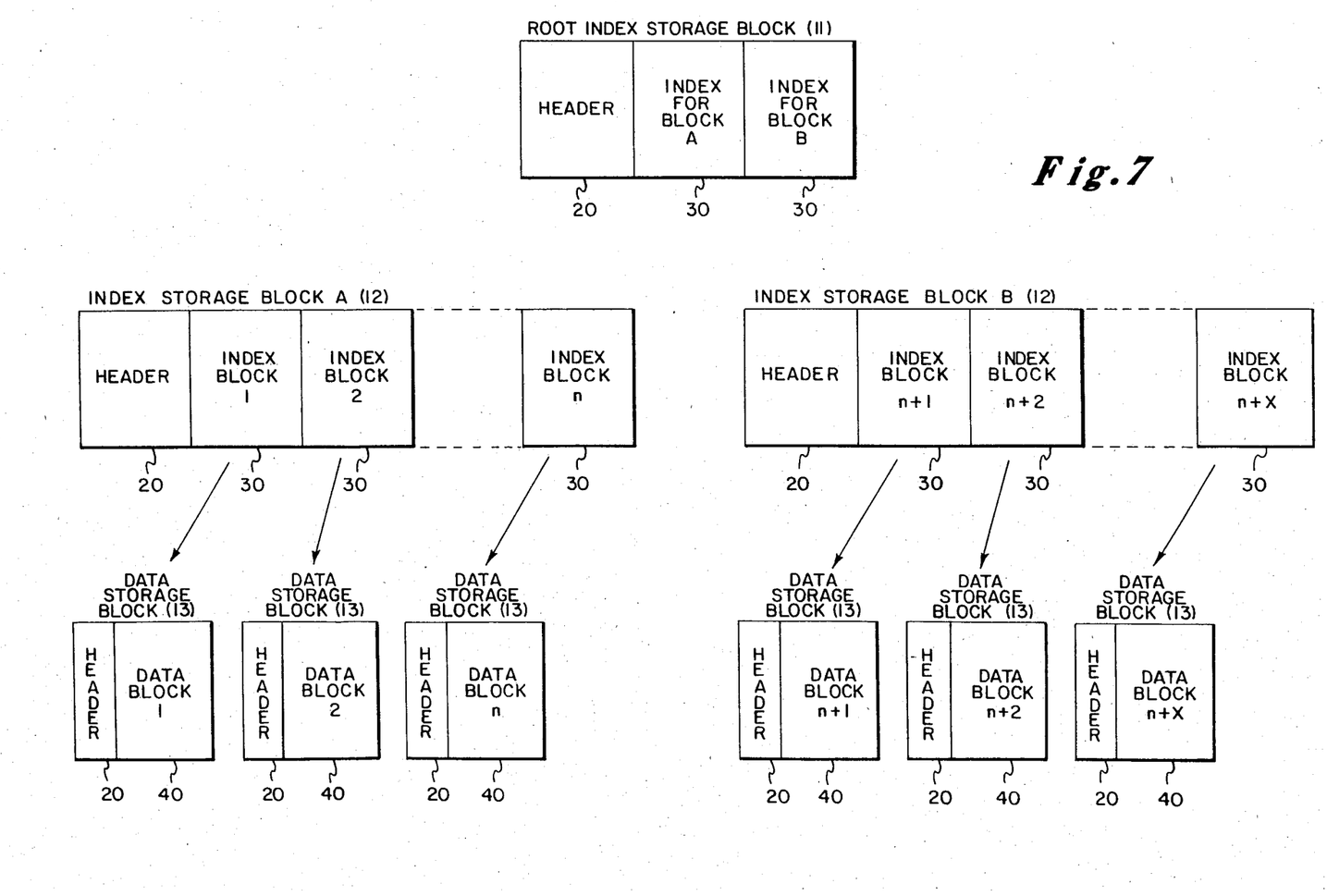
FIG. 7 shows the interrelationship of index and data storage blocks in the file management system utilizing the present invention.

The disk file management system also has the administrative task of keeping track of all memory blocks on the disk whether or not they are assigned to a file, and whether they are index, data, or free blocks. In addition, administrative information regarding each of the files on the disk is also stored. These administrative functions are accomplished by the disk file management system which uses its own VTOC (Volume Table Of Contents) file. FIGS. 5, 6, and 7 show the organization of this VTOC file and these figures are described in detail hereinafter.

In the disk file management system VTOC file are a number of blocks of memory used in accomplishing the administrative function as mentioned previously. Although these blocks will be index, data, or free blocks they are all organized in a buddy block arrangement to provide system crash protection against the loss of administrative information. With the buddy block arrangement the contents of an index block or a memory block are in essence duplicated and stored in adjacent memory blocks. When a buddy block of memory in the VTOC file is accessed the stored information or data is read out of the first 512 byte block of the buddy block, is edited etc. and the revised new version is then stored in the second 512 byte block of the same buddy block in memory. At this time the previous version is in the first part of the buddy block and the new version is in the second part of the buddy block. The next time that the information or data is read out for editing or updating, it is read out of the second part of the buddy block and after updating it is stored in the first part of the buddy block. If at any time the system crashes and the data that is being or has been read out is damaged or destroyed at least the previous version is still in existence.

There are five types of administrative data records which are stored in the VTOC file using Data Blocks. They are: 1. Available Index Record, 2. Free Extent Record, 3. Used Extent Data Record, 4. Chain Record, and 5. Attribute Data Record. These data records each have an identifier stored in the Data Block that indicates to the disk file management system the above listed type of block as the blocks are read.

As previously mentioned all files on the hard disk memory, including the VTOC file, all have assigned 512 byte blocks of memory that are used to store data/information in the file, and a list of the free or unused blocks of assigned memory in each file is maintained for the purpose of selecting and locating blocks of the assigned memory when needed for storing data or information in the file. A list of the free or unused memory blocks assigned to the VTOC is maintained in the Data Block Index 60a, 60b described in detail hereinafter. For blocks of memory assigned to other than the VTOC file, the records are maintained in Used Extent Data Records which are described in greater detail hereinafter.

For the system to know that a block of memory in the VTOC file is an Available Index Record, the "key" which is stored in block segments 41, 42, and 43 of Data Block 40 of an Available Index Record is organized as follows. The "key" is the value X01 followed by a start index number. The X01 indicates to the system that the block is an Available Index Record in the VTOC file, while the start index number indicates to the file management system the start of a range of numbers available to be assigned to file names. That is, an ASCII name of a file is assigned a numerical name used in the VTOC file system.

The file management system also keeps track of the free or unassigned memory blocks that have not been assigned to any file including the VTOC file. This is done so that the disk file management system can locate and assign free memory blocks to any file that needs more blocks and automatically requests same. This free or unassigned memory block information is maintained in the VTOC file using Free Extent Records. In actual operation the free or unused blocks of memory are located in the memory in variable size groups of adjacent blocks. A Free Extent Record is used for each such group of adjacent memory blocks. For the system to known that a block of memory in the VTOC file is a Free Extent Record, the "key" which is stored in block segments 41, 42, and 43 of Data Block 40 is organized as follows. The "key" is the value of X02 followed by a start block number. The X02 indicates to the system that the block is a Free Extent Record, while the start block number indicates to the file management system the logical address in memory of the first block of memory in the range of adjacent memory blocks with which the Free Extent Record is associated. The start block number in the X02 type "key" may be initially compressed in accordance with the teaching of the invention before being further compressed as previously described with reference to block segments 41, 42, and 43. A number is stored in block segment 44 of Data Block 40 of an X02 type Free Extent Record, and the value of the number indicates to the system the amount of data stored in block segment 45 of the same Data Block. The block count is a number stored in block segment 45 of the Data Block and indicates to the system the number of free blocks of memory in the range of memory blocks that follows the logical address of the first free memory block in the range or extent of free blocks identified in the "key". In this manner the last available block of memory in the range or extent of blocks identified by the Free Extent Record is determinable. After some of the memory identified in the Index Record is chosen for use, the number stored in data block segment 45 is changed to reflect only the remaining free memory covered by the Free Extent Record. The available count number in block segment 45 may also be compressed per the teaching of the invention.

The Used Extent Data Record is utilized to store information regarding extents or ranges of memory blocks that are logically adjacent to each other on the hard disk memory and that are actively being used as memory blocks in any file on the disk, excluding the VTOC file. The "key" for this type of record is the value X03 followed by a file identification and an extent identification. The X03 indicates to the system that the block is used for storing information regarding extents or ranges of memory blocks that are actively being used as index or data blocks in any file on the disk, including the VTOC file. The file identification is a number identifying the file, a range of memory blocks of which is associated with the identified file, and is obtained from the Available Index Records and stored in the Chain Records. The extent identification is also a number indicating to the system the number of one of the ranges or extents of memory blocks within the identified file. That is, each range or extent of memory blocks in each file has a discrete number which is the extent identification. If there are five ranges or extents in a file, there are five Used Extent Data Records for the file and each has a number one through five stored in the extent identification portion of the "key". The total number of ranges or extents of adjacent memory blocks within any file is stored elsewhere in the administrative records as described further in this specification. The file identification and extent identification in the X03 record "key" may be initially compressed per the teaching of the invention before being further compressed as previously described with reference to block segments 41, 42, and 43. The number stored in block segment 44 of Data Block 40 of a Used Extent Record indicates the quantity of information that is stored in block segment 45 which stores a start block and block count. The start block is a number indicating to the system the logical address of the first block of memory in the range or extent of memory blocks associated with this Used Extent Record, and the block count is a number indicating the number of memory blocks in the range or extent of blocks that are adjacent to each other in the memory so that the system can determine the logical address of all blocks in the range. The start block and block count just described may also be compressed as taught herein.

A Chain Record is the fourth type of record stored in a Data Block and is used to store identification information regarding file names, library records, and chaining information regarding same. That is, a correspondence between an ASCII name of each of the above and an identification number, where the number is used throughout all the VTOC records to identify the files, libraries, and documents. There is one of these chain records per file or library. The key for this type of record is X04 followed by a node identification and the node name. The value X04 indicates to the system that it is a chain record. The node identification is a number identifying a library of which the stored document is a part. If the document is not stored in a library a zero is entered here. The node identification in the X04 record "key" may be initially compressed in accordance with the teaching of the invention before being further compressed as previously described with reference to block segments 41, 42, and 43. The node name is the ASCII name of a file, library or document with which this chain record is associated. As previously described, a data length number is stored in block segment 44 of the Data Block which indicates the length of the data stored in block segment 45 of the same Block. The data itself stored in block segment 45 is used to equate a number with the above ASCII identification. The data stored in block segment 45 is a prefix followed by either a directory identification or a file identification. The prefix is X00 the chain record is assigned to a library, while the prefix is X01 if the chain record is assigned to a file. Either the X00 or X01 is followed by an assigned number which is equated to the ASCII title by the system as mentioned above. The assigned number that now identifies the library or file to the disk file management system is used to chain to the attribute or range/extent records, and to locate the next level elements. There is no backward chaining stored in this record, are derived by the system on an as needed basis. The identification number is assigned from the Available Index Records. The directory identification and file identification in the Data Block may also be compressed per the invention.

The fifth type of data record is the Attribute Data Record and is used to store attribute information of a file or library identified in the key section of the Data Block. Administrative information regarding files, libraries and documents such as the identity of the creator of the file, the class of protection, the date created, dates modified, count of memory blocks used in the file, and count of available memory blocks in the file are stored in this type of data record block. In the key of this type of data record is the value X05 followed by either a directory identification or file identification, and then followed by an attribute identification. The directory identification consists of a directory identification number which is the same number assigned and entered in the field of the same name in the Chain Record previously described; or is a file identification number which is the same number assigned and entered in the field of the same name in the Chain Record previously described. In this X05 key the directory identification or file identification, and the attribute identification may be preliminarily compressed and then compressed further in the manner that keys are compressed as described previously in this specification with reference to block segments 41, 42, and 43. The data length stored in block segment 44 is the length of data stored in block segment 45 of the Data Block. In block segment 45 is stored attribute values which are numbers that identify the above listed and other attributes regarding the file, library, or document with which this Attribute Data Record is associated. The attribute value information is also compressible using the invention as taught herein.

In FIG. 5 is shown Control Block 50 which illustrates the buddy block operation introduced earlier in this specification. As previously mentioned the use of buddy blocks provide system crash protection against the loss of administrative information of the disk file management system. Blocks 60, 53, 54, and 55 are used as buddy blocks and, accordingly, are shown as blocks 60a and 60b, 53a and 53b, 54a and 54b, and 55a and 55b. With the buddy block arrangement the contents of a memory block are completely duplicated and stored within an adjacent memory block. The dashed lines between buddy blocks 54 and 55 in FIG. 5 represent that there are a multiplicity of buddy blocks 1 through n, as required by the disk file management system. The exact number of buddy blocks that may be used is only limited by the number of bits within the buddy block map stored in block segment 51. The buddy block map is described in the next paragraph. The blocks of memory used as buddy blocks 53, 54, and 55 are not necessarily stored adjacent to each other in hard disk memory 86; and they need not be stored adjacent to the 1K blocks of memory used for block segments 51 and 52. Block segments 51 through 55 and 60 may be anywhere on hard disk memory 86. In addition, all buddy blocks may be data blocks, index blocks, or free blocks not presently used for data storage. All the buddy blocks are only logically related as represented by Control Block 50.

Block segment 51 is a 512 byte block of memory used as a buddy block map which contains one binary bit for each 1K block of memory being used by the disk file management system as a buddy block for storing administrative information in the VTOC file. When a block of memory which is the first part of a buddy block pair is the portion most recently written into, the associated bit in the buddy block map has a "1" written therein. Note that the buddy blocks are updates as a group, and the buddy block map itself is updated only after a series of record updates. When the second part of a buddy block pair is the portion most recently written into, the associated bit in the buddy block map has a "0" written therein. Before reading out a buddy block the disk file management system first consults the buddy block map in block segment 51 to determine which portion of the buddy block has the newest version of stored data, and then reads out that newest data. After the data read out has been edited, or whatever else, it is restored back in the other portion of the buddy block as described above. The buddy block map is updated and a previous zero would be changed to a one, or vice versa. In this manner the system always knows which half of a buddy block has the newest material that should be read out. In the event of a system crash there is not a complete loss of data. A previous version of any of the administrative data is always available in the other portion of the buddy block.

Block segment 60a and 60b in Control Block 50 are a buddy block and stored therein are a Block Index which is shown in greater detail in FIG. 6, and which is described in greater detail in the next paragraph. As previously mentioned block segments 53 through 55, representing buddy blocks 1 through n, may be used as index blocks and data blocks, or may be free blocks not yet used for the storage of administrative information.

In FIG. 6 is shown Block Index 60 which is used by the disk file management system for the administrative task of keeping track of the VTOC file memory blocks. One main administrative task accomplished using Block Index 60 is to keep track of the number of free or available blocks of memory in the VTOC file. In addition, administrative information regarding each of the files on hard disk memory 86 is stored in buddy blocks 1 through n, which are shown as block segments 53 through 55 in FIG. 5. In FIG. 6 the block segments are shown in two rows only for ease of presentation.

Block segment 61 of block index 60 contains the entry "1107VTOC" to identify that it is part of the VTOC file. Block segment 62 is entitled 'version number' and contains an entry that identifies the current version of the disk file management system. Block segment 63 is entitled 'number of blocks in file' and contains a number which identifies the number of memory blocks on the disk that presently are assigned to the VTOC file. Block segment 64 is entitled 'number of bits in map' and contains a number which indicates the number of bits of memory in the buddy block map in block segment 51. This number indicates the maximum number of buddy blocks that may be allocated in the VTOC file because each buddy block must have one bit in the buddy block map. Block segment 65 is entitled 'number of free blocks' and a number is stored therein which indicates the number of free or available memory blocks on the hard disk assigned to the VTOC file that have not yet been used for the storage of index or data information.

As the free blocks assigned to the VTOC file are used, the number stored in block segment 65 is updated to properly reflect the current number of free memory blocks in the VTOC file. Block segment 66 is entitled 'extend block size' and a number is stored therein which indicates the number of unused blocks of memory, not yet assigned to any file, that should be added to the VTOC file on hard disk memory 86 when the file nears using all its assigned, unused blocks of memory. This is used for self-extension of VTOC file size on hard disk memory 86 as that file is filled. Block segment 67 is entitled 'block number of first data block' and is a logical address identifying the location of the first buddy block in the VTOC file used to store data. This would be one of buddy blocks 53 through 55 in FIG. 5. Block segment 68 is entitled 'block number of first free block' and is a logical address identifying the location of the first free buddy block in the VTOC file that is unused for storing index or data in the VTOC file. These free blocks in the VTOC file are chained together so that with the address of the first free block the system can find all the free blocks. Block segment 69 is entitled 'block number of last free block' and is a logical address identifying the location of the last free buddy block in the VTOC file that is unused for storing index or data in the VTOC file. In block segment 69 is stored the last block number of the range of blocks available to be assigned to files. With the numbers stored in blocks 68 and 69 the system knows how much and where the free blocks of memory are located on hard disk memory 86. Block segment 91 is entitled 'number of index levels in file' and is a number identifying the number of index levels in the VTOC file structure. This is better understood in view of FIG. 7 which shows an exemplary organization of index and data blocks in the VTOC file. This information is necessary to the disk file management system so that it knows how many levels of index blocks there are in order to properly interpret data read out of a block of memory as being index or data. In FIG. 7 there are two rows of index blocks. The first or upper row shows root index storage block 11, while the second or middle row shows two index storage blocks 12. There may be more than two blocks in each level of the tree structure, except for the first or root level. The root index storage block is not counted, so the number that would be stored in block segment 91 for this example would be the number one. If there had been three rows of index blocks including the root index storage block, the number two would be entered into block segment 91 in FIG. 6. Initially, before the VTOC file has grown, there will only be the root index storage block 11 and no index storage blocks 12, so the number in block segment 91 will be zero per the examples given above.

The remaining block segments of Block Index 60 in FIG. 6 are grouped into sets of two block segments each. Block segment pairs 92 and 93, or 94 and 95 are examples and are repeated, one pair of each extent or range of blocks of memory in which buddy blocks or the buddy block map are stored. The first block segment 92 and 94 of each pair of block segments is entitled 'first block os address extent' and stored therein is the starting logical addresses on hard disk memory 86 of extents or ranges of adjacent blocks of memory in which are stored the buddy block map and the buddy blocks. Block segments 93 and 95 are entitled 'length of address file' and are used to store the the extent or number of adjacent memory blocks storing buddy block information starting at the address in the associated pair one of block segments 92 and 94. There are up to sixty-four extents of these block segment pairs in the VTOC filing scheme.

In FIG. 7 is shown the relationship and chaining of Index Records and Data Records in the VTOC filing scheme. This is a basic tree memory structure. These Records are made up of Headers 20, Index Blocks 30, and Data Blocks 40, all previously described, and which are the basic elements for creating these Index and Data Records. At the top of the tree there is a Root Index Storage Block 11. In searching for anything in the VTOC file the disk file management system must start at Block 11. In the simplest form Root Index Storage Block 11 will be made up of a Header 20 and one Index Block 30 in a memory storage block. This will not fill the block of memory so there is room for expansion to add more than one Index Block 30, such as shown in FIG. 7. In this simplest example block segments 23 and 24 of Header 20 in Block 11 will have zeroes stored therein as there is only one index block and there cannot be other logical blocks on the same level therewith in the tree structure. The logical address stored in block segment 34 of Index Block 30 in Block 11 points directly to one Data Storage Block 13 in FIG. 7, instead of to another Index Storage Block 12 at a second layer in the tree structure such as shown in FIG. 7. As the number of Data Storage Blocks 13 becomes larger, an intermediate Index Storage Block 12 is needed, and the 'next block number—lower level' stored in block segment 34 in Index Block 30 within Root Index Storage Block 11 has the logical address of this first intermediate Index Storage Block 12.

The makeup of an intermediate Index Storage Block 12 is alike that of the Root Index Storage Block 11. There is a Header 20 of the type shown in FIG. 2 and described previously in this specification, and there are a multiplicity of Index Blocks 30 of the same type as shown in FIG. 3 and also described previously in this specification. There is an Index Block 30 in intermediate level Index Storage Block 12 for each Data Storage Block 13 as shown in FIG. 7. Each intermediate level Index Storage Block 12 is a block of memory and can store a Header 20 and a number of Index Blocks 30 until the block of memory is used up. Thereafter, as as more Data Blocks 40 are created, a second intermediate level Index Storage Block 12 is required which can again handle another number of Index Blocks 30 until the block of memory is used up. However, for a second intermediate level Index Storage Block 12 another index 30 is needed in Root Index Storage Block 11 as shown in FIG. 7 as 'Index for Block B'. For each additional intermediate level Index Storage Block 12 another index 30 is needed in Root Index Storage Block 11 until the block of memory of which Block 11 is comprised is filled up. In intermediate level Index Storage Block 12, in each Index Block 30 therein (1,2 through n), block segment 34, entitled 'next block number—lower level', has a logical address stored therein pointing to an associated Data Block 40 as shown in FIG. 7. For example, Index Block n (30) in Index Storage Block A (12) provides indexing for Data Block n (40) in a Data Storage Block 13. Each Data Storage Block 13 is also a block of memory, and upon being filled another Data Storage Block 13 is required for further storage. Each subsequent Block 13 is chained to the previous Block 13 and to the subsequent Block 13.

When the VTOC file memory tree structure is the exemplary form shown in FIG. 7, there are two Index Storage Blocks (12), blocks A and B, which are the same intermediate level in the structure. In addition, as shown in FIG. 7, there are six Data Storage Blocks 13, with three being associated with one Index Storage Block 12 and the other three being associated with the other Index Storage Block 12. These six Data Storage Blocks 12 are all at the same lower level in the memory tree structure. With more than one memory block being at each of the intermediate and lower levels of the tree structure, horizontal chaining of the blocks is required. The horizontal chaining is provided by the Header 20 prefixing both Index Storage Blocks 12 and Data Storage Blocks 13. Referring to FIG. 2, Header 20 prefixing Index Storage Block A (12) has a block segment 23 entitled 'logical block number of next block at same level', and a block segment 24 entitled 'logical block number of previous block at same level'. In the intermediate level in the tree structure shown in FIG. 7, both segment 23 of Header 20 in Index Storage Block A (12) has the logical block number for Index Storage Block B (12) stored therein. Since there is not a previous Index Storage Block 12, in block segment 24 of Header 20 in Index Storage Block A (12) is stored all zeroes. Thus, Index Storage Block A (12) is chained forward on a horizontal level to Index Storage Block B (12).

Similarly, Index Storage Block B (12) is chained backward to Index Storage Block A (12), but is not chained forward since there is no subsequent Block 12. More specifically, block segment 23 of Header 20 in Index Storage Block B (12) has all zeroes stored therein since there is no next or subsequent Block 12 in FIG. 7. However, block segment 24 of Header 20 in Index Storage Block B (12) has the logical address of Index Storage Block A (12) stored therein to accomplish the backward chaining. Thus, Index Storage Block B (12) is chained backward on a horizontal level to Index Storage Block A (12).

In the bottom level of the tree structure shown in FIG. 7, all the Data Storage Blocks 13 are chained forward and backward in the same manner as were the Index Storage Blocks. Without going into the fine detail, which is the same as already described, for the Data Storage Blocks 13, Data Block 1 (50) has no backward chaining, but is chained forward to Data Block 2 (40). Data Block 2 (40) is chained both forward to Data Block n (40) and backward to Data Block 1 (50). Finally, Data Block n (40) is not chained forward, but is chained backward to Data Block 2 (40). Data Blocks 1,2, and n are not chained at all to Data Blocks n+1, n+2, and n+x. Data Blocks n+1, n+2, and n+x are similarly chained to each other in a forward and backward fashion as has just been described, but are not chained to Data Storage Blocks 1, 2, and n.

The operation of the disk file management system to provide the self extending file feature is spread throughout the description and is not focalized in one place. Accordingly, the reader may not yet have a complete understanding thereof. A concise review is here culled from the previous portion of the detailed description. With reference to Block Index 60 in FIG. 6, it has been described how in block segment 63 is stored the total number of blocks of memory that have been assigned to the exclusive use of the VTOC file. In block segment 65 is stored the total number of blocks of memory in the VTOC file that have not yet been used to store data. The difference between these two numbers is the number of blocks of memory in the VTOC file that have already been used to store data. When the number of free memory blocks identified in block segment 65 goes below a predetermined number the disk file management system takes the number stored in block segment 66 to get that amount of blocks of memory not assigned exclusively to any file and transfers them to exclusive use in the VTOC file. The numbers stored in block segments 63 and 65 are accordingly updated. To locate the available blocks of memory on hard disk memory 86 for transfer to the exclusive use of the VTOC file, or to any other file, the disk file management system goes to the Free Extent Records which have been described heretofore, and in which is stored information regarding the logical address and quantity of free blocks of memory on hard disk memory 85. For files other than the VTOC file, in the Attribute Data Records is stored information regarding each specific file including the number of 1K memory blocks assigned to each file and the number of memory blocks already used to store data in each file. The difference between these two numbers is the remaining number of free memory blocks assigned to each specific file. When the system determines that the number of free blocks assigned to the VTOC file is too low, self extension of the file is started. Also stored in the Attribute Data Records is a number indicating the number of blocks of memory that should be added to the file when its memory capacity is self extended. The system uses this extension number and again goes to the previously described Free Extent Records to identify free memory blocks not assigned exclusively to any particular file. The specified number of these free blocks is transferred to the exclusive use of the file being expanded and the Free Extent Records and Attribute Data Records are amended to reflect the transfer of blocks of memory to the exclusive use of the particular file.

In various places throughout the specification it was pointed out that certain information or data could be compressed. Examples of these were particularly pointed out in the five types of records used in the VTOC file. In the prior art typically a given amount of space is allocated wherein to store certain data, and that amount of space is inflexible so that even if all the space is not required, remaining space is wasted. Therefore there is never any real need to compress the binary information stored in these inflexible block segments. With the present technique this wasted space is minimized and the bit or byte size of block segments is variable to reduce the amount of unused memory space. Only the amount of memory space actually required to store binary information is used. To accomplish compression in the VTOC records per the teaching of the present invention the disk file management system analyzes a binary number to be compressed and stored, that may represent any kind of information, to determine which one of four binary number size ranges the number falls in. The ranges are 0 to 63, 64 to 16447, 16448 to 4210751, and 4210752 to 1077952575. In addition, the disk file management system subtracts a given number from the information to be stored depending on the aforementioned range in which the number falls. For small binary numbers to be stored that fall in the lowest range of 0 to 63, zero is subtracted from that binary number and the two bits 00 are prefixed to the uncompressed number. The uncompressed number with the 00 prefix is then stored as an eight-bit byte. Upon being read out at a later time the disk file management system first reads the first two bits and determines from them being 00 that the number was stored as eight bits and therefore uses the binary number read out as is, less the 00 prefix.

For slightly larger binary numbers to be stored that fall in the next range of 64 to 16447, the binary 64 is subtracted from that binary number to compress it and the two bits 01 are prefixed to the compressed number. The compressed number with the 01 prefix is then stored as two eight-bit bytes. Upon being read out at a later time the disk file management system first reads the first two bits and determines from them being 01 that the number was compressed by subtracting the quantity 64 and then adds the quantity 64 back to the number read out to reverse the compression process. The system then uses the decompressed number less the 01 prefix.

For yet larger binary numbers to be stored that fall in the next range of 16448 to 4210751, the quantity 16448 is subtracted from that binary number to compress it and the two bits 10 are prefixed to the compressed number. The compressed number with the 10 prefix is then stored as three eight-bit bytes. Upon being read out at a later time the disk file management system first reads the first two bits and determines from them being 10 that the number was compressed by subtracting the quantity 16448 and then adds that quantity back to the number read out to reverse the compression process. The system then uses the decompressed number less the 10 prefix.

For the largest binary numbers expected to be stored that fall in the next range of 4210752 to 1077952575, the quantity 4210752 is subtracted from that binary number to compress it and the two bits 11 are prefixed to the compressed number. The compressed number with the 11 prefix is then stored as three eight-bit bytes. Upon being read out at a later time the disk file management system first reads the first two bits and determines from them being 11 that the number was compressed by subtracting the quantity 4210752 and then adds that quantity back to the number read out to reverse the compression process. The system then uses the decompressed number less the 11 prefix.

In the above described manner the hard disk file system may also compresses any other binary information to be stored on the hard disk memory to thereby maximize the information that can be stored thereon.

While what has been disclosed herein is the preferred embodiment of the invention, it will be obvious to those skilled in the art that the teaching of the invention may be applied in many different ways without departing from the spirit and scope thereof.

What is claimed is:

1. In a computer system, a bit string representing an integer value belonging to a given range comprising:
   a first field containing a first bit code representing a first integer value which is the result of subtracting a second integer value associated with the given range from the integer value to be represented; and
   a second field containing a second bit code identifying the number of bits in the first bit code and the second integer value.

2. In the bit string of claim 1 and wherein:
   the given range of values is one of an ordered set of ranges wherein the values in any range are greater than those in any preceding range.

3. In the bit string of claim 2 and wherein:
   for any bit string representing an integer value in a given range, the bit string representing an integer value in the next higher range is larger by a fixed number of bits than the bit string representing the value in the given range.

4. In the bit string of claim 3 and wherein:
   the bit string consists of a sequence of at least one representation word, each of which contains the fixed number of bits;
   the bit string representing a given integer value requires a number of representation words corresponding to the index of the range to which the given integer value belongs in the ordered set of ranges; and
   the leftmost representation word of the sequence contains the second bit code.

5. In the bit string of claim 4 and wherein:
   the ranges are contiguous;
   the representation word contains 8 bits; and
   the second integer value associated with a given range is one greater than the largest value in the preceding range.

6. In the bit string of claim 1 and wherein:
   the given range of values is one of an ordered set of contiguous ranges.

7. In the bit string of claim 6 and wherein:
   the second integer value associated with the given range is one larger than the largest value in the preceding range.

8. In the bit string of claim 7 and wherein:
   the set of contiguous ranges begins at 0 and
   the second integer value employed to produce the first integer value when the represented value is in the first range is 0.

9. A method used in a computer system of making a bit string
   representing an integer value falling within a given range
   comprising the steps of:
   producing a first bit code representing a first integer value which is computed by subtracting a second integer value associated with the given range from the integer value to be represented and
   appending a second bit code identifying the associated second integer value and the number of bits in the first integer value to the first bit code.

10. In the method of claim 9 and wherein:
    the given range of values is one of an ordered set of ranges of values wherein the values in any range are greater than the values in any preceding range and
    the method includes the step of determining which of the ranges of values the integer value to be represented belongs to.

11. In the method of claim 10 and wherein:
    the ranges of values are contiguous and
    the method includes the step of associating a value one larger than the maximum value in the immediately preceding range with the given range as the second integer value.

12. In the method of claim 11 and wherein:
    the ranges begin at 0 and
    the method includes the step of associating the value 0 as the second integer value with the lowest range.

13. In a computer system employing bit strings wherein an integer value is represented by means of a bit string containing a first code representing a first integer value and a second code identifying the number of bits in the first code and a second integer value, the method of obtaining the represented integer value from the bit string comprising the steps of:

determining the length of the first bit code and the second integer value from the second bit code and adding the second integer value to the integer value specified by the first bit code.

* * * * *